United States Patent [19]

Shin et al.

[11] Patent Number: 5,450,030
[45] Date of Patent: Sep. 12, 1995

[54] CIRCUIT FOR ADJUSTING A CIRCUIT PARAMETER OF A CIRCUIT

[75] Inventors: Young-ho Shin; Jeung-in Lee, both of Kyungki, Rep. of Korea

[73] Assignee: Samsung Electronics Co., Ltd., Suwon, Rep. of Korea

[21] Appl. No.: 258,103

[22] Filed: Jun. 10, 1994

[30] Foreign Application Priority Data

Jun. 11, 1993 [KR] Rep. of Korea ............. 93-10634

[51] Int. Cl.[6] ........................................... H01H 37/76
[52] U.S. Cl. ................................................ 327/525
[58] Field of Search ................ 257/529, 530; 327/525, 327/530

[56] References Cited

U.S. PATENT DOCUMENTS 5,047,664  9/1991  Moyal .............................. 327/530
5,361,001 11/1994  Stolfa .............................. 327/525

*Primary Examiner*—Timothy P. Callahan
*Assistant Examiner*—Jeffrey Zweizig

*Attorney, Agent, or Firm*—Robert A. Westerlund; Stephen R. Whitt; Charles R. Donohoe

[57] ABSTRACT

A circuit parameter adjustment circuit for adjusting a circuit parameter (e.g., resistance or capacitance) of a circuit having N network elements connected between two nodes. The circuit parameter adjustment circuit includes N zapping devices and N switching devices coupled between the N zapping devices and the N network elements. When a zapping control signal is low, the N switching devices are directly responsive to respective ones of the N trimming signals for bypassing or not bypassing the respective ones of the N network elements, thereby facilitating testing of the value of the circuit parameter for different combinations of the trimming signals, prior to zapping the zapping devices. Then, after the optimum combination of trimming signals has been selected, the zapping control signal is driven high, whereby the N zapping devices are zapped or unzapped, depending upon the logic level of the respective ones of the N trimming signals.

48 Claims, 5 Drawing Sheets

CIRCUIT FOR ADJUSTING A CIRCUIT PARAMETER OF A CIRCUIT

BACKGROUND OF THE INVENTION

The present invention relates generally to a circuit for adjusting a circuit parameter (e.g., a resistance or capacitance value) of a semiconductor integrated circuit by "zapping," and more particularly, to a circuit of this type in which the adjusted value of the circuit parameter is ascertained prior to zapping, by testing, to thereby attain the target value more precisely, while avoiding damage to surrounding circuitry during zapping.

Generally, in the manufacture of a semiconductor integrated circuit, target values of circuit parameters such as resistance and capacitance are often hard to achieve, due to manufacturing process errors and a variety of other factors. In order to attain target values for a circuit, conventional zapping employs a method by which "zappable" fuses connected in parallel with circuit trimming components are blown (commonly referred to as "metal zapping") or Zener diodes connected in parallel with the circuit trimming components are shorted out (commonly referred to as "Zener zapping").

FIG. 1 illustrates an exemplary conventional circuit for circuit parameter adjustment using metal zapping.

With reference to FIG. 1, a conventional circuit for achieving a predetermined target value (here, a resistance) of a circuit (here, a resistor network) between nodes X and Y is comprised of resistors $R_1$, $R_2$ and $R_3$ serially connected between nodes X and Y, metal zapping pieces $M_1$, $M_2$ and $M_3$ connected in parallel with resistors $R_1$, $R_2$ and $R_3$, respectively, and terminals $A_1$, $A_2$, $A_3$ and $A_4$ connected to respective contact points between the metal pieces and resistors. The metal zapping pieces $M_1$, $M_2$ and $M_3$ are fuses made of a conductive material such as copper or aluminum.

In such a configuration, in order to achieve a given target value between nodes X and Y, high voltage is applied across the terminals $A_1$, $A_2$, $A_3$ and $A_4$ connected to the respective metal pieces $M_1$, $M_2$ and $M_3$ (which are each connected to a resistive network in a circuit device), to thereby sequentially "zap" the metal pieces until the target value is reached or to simultaneously fuse the metal pieces in accordance with the applied voltage.

FIG. 2 illustrates an exemplary conventional circuit for adjusting a circuit parameter using Zener zapping.

With reference to FIG. 2, the conventional Zener zapping circuit is comprised of resistors $R_1$, $R_2$ and $R_3$ serially connected between nodes X' and Y' Zener diodes $Z_1$, $Z_2$ and $Z_3$ parallel-connected to respective resistors $R_1$, $R_2$ and $R_3$, and terminals $B_1$, $B_2$, $B_3$ and $B_4$ connected to the circuit at common contact points between the Zener diodes and resistors.

With such a configuration, zapping is performed by shorting respective Zener diodes $Z_1$, $Z_2$ and $Z_3$ sequentially until a target resistance value between nodes X' and Y' is reached, or by simultaneously shorting Zener diodes selected in accordance with the applied voltage.

However, such circuits for adjusting circuit parameters for a semiconductor integrated circuit require a long time for obtaining target values. Further, in such conventional circuits, high voltage or high current is directly applied to network elements, which can cause damage to surrounding circuitry.

In addition, if the target value is not attained by zapping, the once-zapped device is unusable and must be discarded.

SUMMARY OF THE INVENTION

Therefore, it is an object of the present invention to provide a circuit for adjusting a circuit parameter for a semiconductor integrated circuit in which the result of a zapping operation is tested prior to :zapping, in order to determine whether a target value will be obtained after zapping, so that damage to surrounding circuitry is avoided.

It is another object of the present invention to provide a circuit for adjusting a circuit parameter for a semiconductor integrated circuit in which input terminals for zapping are isolated after zapping so as to prevent the circuit from being influenced by unwanted noise like static electricity or spiking.

It is still another object of the present invention to provide a circuit for adjusting a circuit parameter for a semiconductor integrated circuit in which the number of external pins is reduced, to thereby facilitate post-packaging zapping.

It is yet another object of the present invention to provide a method for accomplishing the above objects.

To accomplish the first object of the present invention, there is provided a circuit for adjusting a circuit parameter for a semiconductor integrated circuit, which opens or closes N network elements connected between two nodes according to N trimming signals, to thereby achieve a predetermined target value of the circuit parameter, and which performs zapping according to te N trimming signals when a zapping control signal is activated. The circuit includes N zapping portions being zapped according to the trimming signal when the zapping control signal is activated; and, N switching means which, before the zapping control signal is activated, directly receives the trimming signal and opens or closes the respective network elements according to the input so as to test whether an achieved value according to the trimming signal is sufficiently equal to the target value, and after the zapping control signal is activated, opens or closes the respective network elements according to the output of the zapping portions.

To accomplish the second object of the present invention, there is provided a circuit for adjusting a circuit parameter for a semiconductor integrated circuit, which opens or closes N network elements connected between two nodes according to N trimming signals, and which isolates the trimming signal input terminals in response to an end control signal, after zapping. The circuit includes N isolating means for receiving and outputting the trimming signal without change before the end control signal is activated, and holding the output value at a predetermined value after the end control signal is activated, to thereby isolate the input terminals from the remainder of the circuit; N zapping portions which are zapped according to the N trimming signals; and, switching means which, before the zapping control signal is activated, directly receive the output of the isolating means to thereby open or close the respective network elements according to the N trimming signals, and after the zapping control signal is activated, opens or closes the respective network elements according to the output of the zapping portions.

To accomplish the third object of the present invention, there is provided a circuit for adjusting a circuit parameter for a semiconductor integrated circuit, which opens or closes N network elements connected between two nodes according to N trimming control signals supplied from a microcomputer after packaging. The circuit includes trimming signal generating means for generating N trimming signals, the trimming signal generating means being serially interfaced with the microcomputer; zapping portions which are zapped according to the trimming signals when a zapping control signal is activated; and, switching portions which, before the zapping control signal is activated, directly receive the N trimming signals to thereby open or close the respective network elements in accordance therewith, and after the zapping control signal is activated, opens or closes the respective network elements according to the output of the zapping portions, whereby the number of externally interfaced pins required for zapping is reduced, to thereby facilitate zapping after packaging.

To accomplish the fourth objective of the present invention, there is provided a method for adjusting a circuit parameter for a semiconductor integrated circuit, which obtains a target value of a plurality of network elements connected between two nodes. The method includes the steps of receiving the target value; combining the network elements and generating trimming signals for obtaining the target value; measuring a circuit parameter between the nodes according to the generated trimming signals; comparing the measured circuit parameter with the target value, and if the measured circuit parameter is inconsistent with the target value, repeating the combining step and the measuring step until the measured circuit parameter is consistent with the target value; and, zapping, according to the trimming signals, to obtain the target value, when a zapping control signal is activated.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
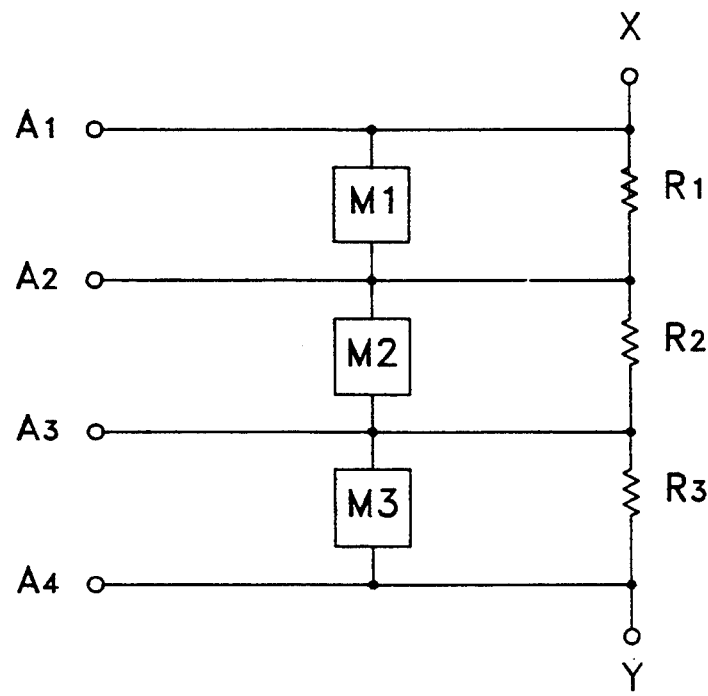
FIG. 1 is a schematic diagram of an exemplary conventional circuit for adjusting a circuit parameter by using metal zapping.
Figure 2:
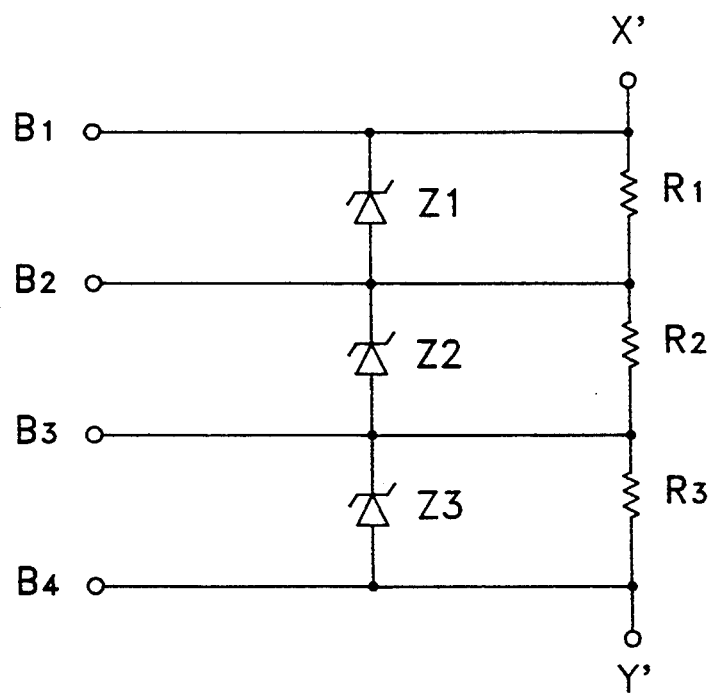
FIG. 2 is a schematic diagram of an exemplary conventional circuit for adjusting a circuit parameter by using Zener zapping.
Figure 3:
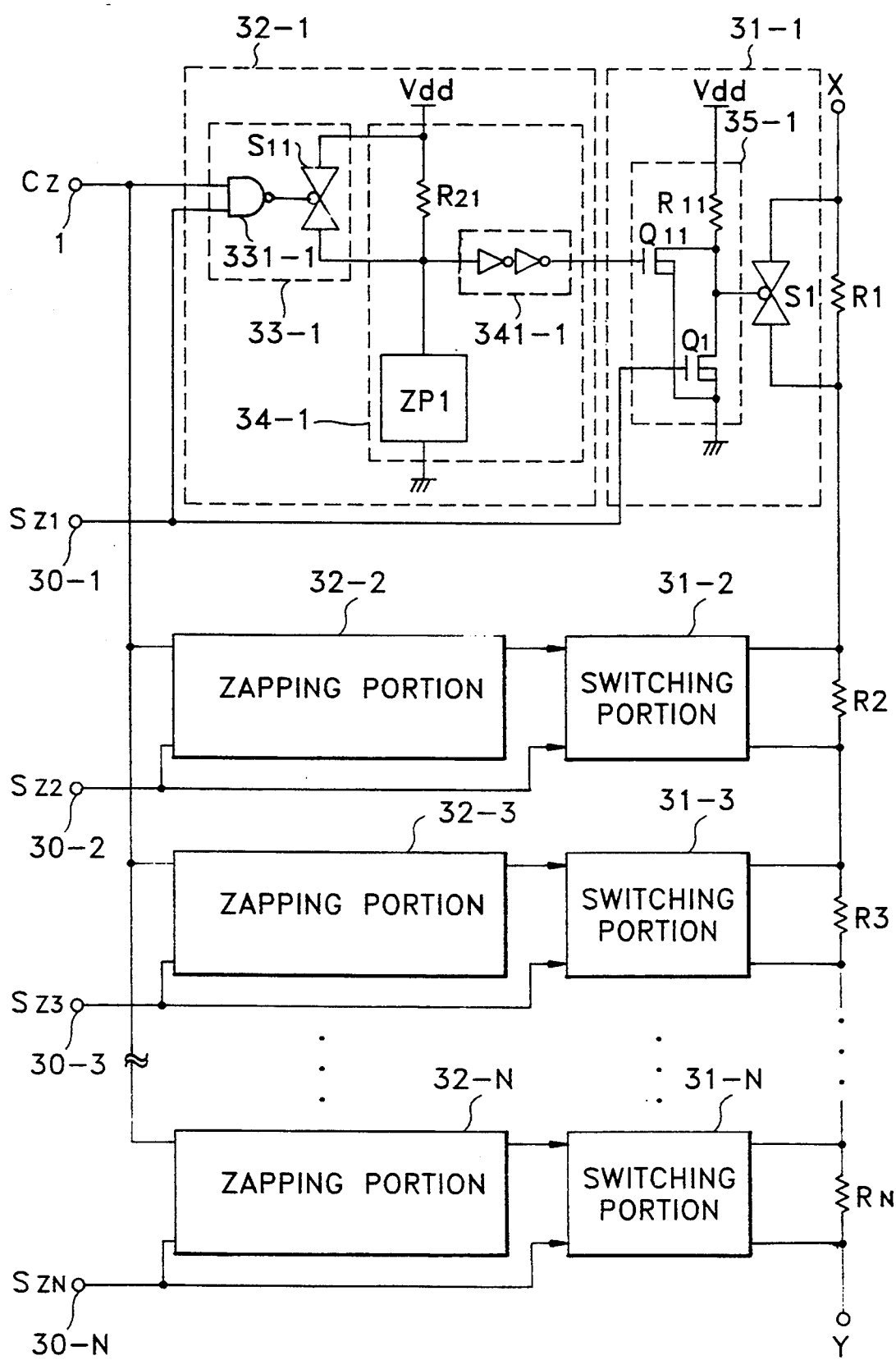
FIG. 3 is a circuit diagram of a ,circuit for adjusting a circuit parameter for a semiconductor integrated circuit according to a first embodiment of the present invention.

With reference to FIG. 3, there can be seen a circuit for adjusting a circuit parameter for a semiconductor integrated circuit constructed in accordance with a first embodiment of the present invention. The semiconductor integrated circuit includes N network elements (resistors $R_1$-$R_N$ in this embodiment) serially connected between nodes X and Y. The circuit of the present invention includes N switching portions $31_1$-$31_N$ parallel-connected to network elements $R_1$-$R_N$. With this arrangement, before a zapping control signal $C_Z$ is activated, trimming signals $S_{Z1}$-$S_{ZN}$ are directly values of via input terminals $30_1$-$30_N$, and respective network elements $R_1$-$R_N$ are then opened or closed according to the values of respective ones of the trimming signals, to thereby achieve a predetermined resistance, and after the zapping control signal $C_Z$ is activated, respective network elements $R_1$-$R_N$ are opened or closed according to the outputs of respective zapping portions $32_1$-$32_N$. The zapping portions $32_1$-$32_N$ are zapped in response to the trimming signals $S_{Z1}$-$S_{ZN}$ when the zapping control signal is activated, to thereby achieve a target resistance value.

In the following description, although only first switching portion $31_1$ and first zapping portion $32_1$ are described, it should be understood that all of the N switching portions and zapping portions have the same construction, respectively.

The first switching portion $31_1$, includes a switching controller $35_1$ which, before zapping control signal $C_Z$ is activated, directly receives first trimming signal $S_{Z1}$ via input terminal $30_1$ and is turned on or off according to the value (level) of the first trimming signal $S_{Z1}$, to thereby enable testing to determine whether the resistance value obtained upon activating the zapping control signal will equal the target value. After zapping control signal $C_Z$ is activated, the switching controller $35_1$ receives first trimming signal $S_{Z1}$ from first zapping portion $32_1$. The first switching portion $31_1$ also includes a switch $S_1$ parallel connected to a first network element $R_1$ for bypassing or not bypassing the network element according to the value (level) of the output of the switching controller $35_1$.

More specifically, the switching controller $35_1$ is comprised of a transistor $Q_1$ and a transistor $Q_{11}$ (MOS transistors in this embodiment), and a pull-up resistor $R_1$. In operation, if the first trimming signal $S_{Z1}$ is high, the transistor $Q_1$ is turned on, whereby the output of the switching controller 35-1, which serves as the control input of a switch $S_1$ (a CMOS transmission gate in this embodiment), is driven to a logic low level, thereby rendering the transmission gate $S_1$ conductive. If the first trimming signal $S_{Z1}$ is low, the transistor is turned off, whereby the output of the switching controller 35-1 is driven to a logic high level, to thereby open the transmission gate $S_1$.

When the transmission gate $S_1$ conducts, the influence of first network element $R_1$ which is parallel-connected to transmission gate $S_1$ is bypassed, and thereby excluded from the network between nodes X and Y. On the other hand, if the transmission gate $S_1$ is opened, the first network element $R_1$ is not bypassed. Thus, the resistance between nodes X and Y is the sum of the resistances of those network elements corresponding to opened transmission gates.

In accordance with the present invention, prior to zapping (in response to trimming signals $S_{Z1}$-$S_{ZN}$), the respective transmission gates $S_1$-$S_N$ of switching portions $31_1$-$31_N$ are made conductive or are opened by the corresponding switching controller in accordance with the trimming signals, to thereby facilitate testing whether the achieved value between nodes X and Y is equal to the target value. Accordingly, this invention overcomes the problems which occur with prior art Zapping techniques when the achieved value does not coincide with the target value.

The first zapping portion $32_1$ includes a zapping controller $33_1$ which is operative, when the zapping control signal $C_Z$ is activated (logic "high"), for either applying or blocking a power source voltage (Vdd) for zapping or not zapping the zappable device $34_1$, depending on the output of the zapping controller $33_1$.

The zapping controller $33_1$ includes a NAND gate $331_1$ and a switch $S_{11}$ which perform an inverse logical multiplication with respect to zapping control signal $C_Z$ and first trimming signal $S_{Z1}$, so as to open or close switch $S_{11}$ (a CMOS transmission gate in this embodiment). Zappable device $34_1$ is made up of a zappable element $ZP_1$, e.g., a metal fuse or Zener diode, which is opened or shorted by power source voltage Vdd applied via transmission gate $S_{11}$ and resistor $R_2$. Optionally, a waveform shaper 341-1 can be added between the output of the zappable device $34_1$ and the gate input of MOS transistor $Q_{11}$.

Now, the operation of first zapping portion $32_1$ will be explained in terms of two cases: prior to the activation of zapping control signal $C_Z$, and after the activation of the zapping control signal $C_Z$.

Before zapping control signal $C_Z$ is activated, the $C_Z$ input to NAND gate 331-1 is at a logic low level, and the output of the NAND gate 331-1, which is applied to transmission gate $S_{11}$, is at a logic high level, regardless of the value of the trimming signal $S_{Z1}$, thereby opening the transmission gate $S_{11}$, whereby the gate of transistor $Q_{11}$ is held low, i.e., at ground potential, via zappable element $ZP_1$, to thereby maintain transistor $Q_{11}$ in a non-conductive state ("off"). In this case, switching portion 31-1 opens or closes transmission gate $S_1$ according to the value (logic level) of the first trimming signal $S_{Z1}$ directly input to the switching controller 35-1.

When the zapping control signal $C_Z$ is activated, the $C_Z$ input to NAND gate 331-1 is at a logic low level. Thus, if the first trimming signal $S_{Z1}$ is low, a logic high level signal is output by the NAND gate 331-1 and applied to the control input of the transmission gate $S_{11}$, thereby closing the transmission gate $S_{Z1}$, whereby transistor $Q_{11}$ is turned off, its gate being held low via zappable element $ZP_1$. If first trimming signal $S_{Z1}$ is high, NAND gate 331-1 outputs a logic low level signal to the control input of transmission gate $S_{11}$, thereby rendering the transmission gate $S_{11}$ conductive, whereby power source voltage Vdd is applied to and thereby opens zappable element $ZP_1$. With zappable element $ZP_1$ open, transistor $Q_{11}$ is turned on by virtue of a logic high level signal being applied to its gate via pull-up resistor $R_{21}$ and waveform shaper 341-1, whereby the transmission gate $S_1$ is rendered conductive.

Since the zappable element $ZP_1$ cannot be restored once it is opened, the zappable element $34_1$ maintains the control of first trimming signal $S_{Z1}$, thereby maintaining the achieved resistance between nodes X and Y.

In accordance with the present invention, prior to the zapping of respective zapping portions $32_1$-$32_N$, zapping control signal $C_Z$ is in the inactive state, and the entire circuit is in a testing mode, whereby various combinations of the trimming signals $S_{Z1}$-$S_{ZN}$ can be tried and the achieved resistance values between nodes X and Y measured, until the optimal combination of trimming signals is obtained. Then, the zapping control signal $C_Z$ is activated.

Figure 4:
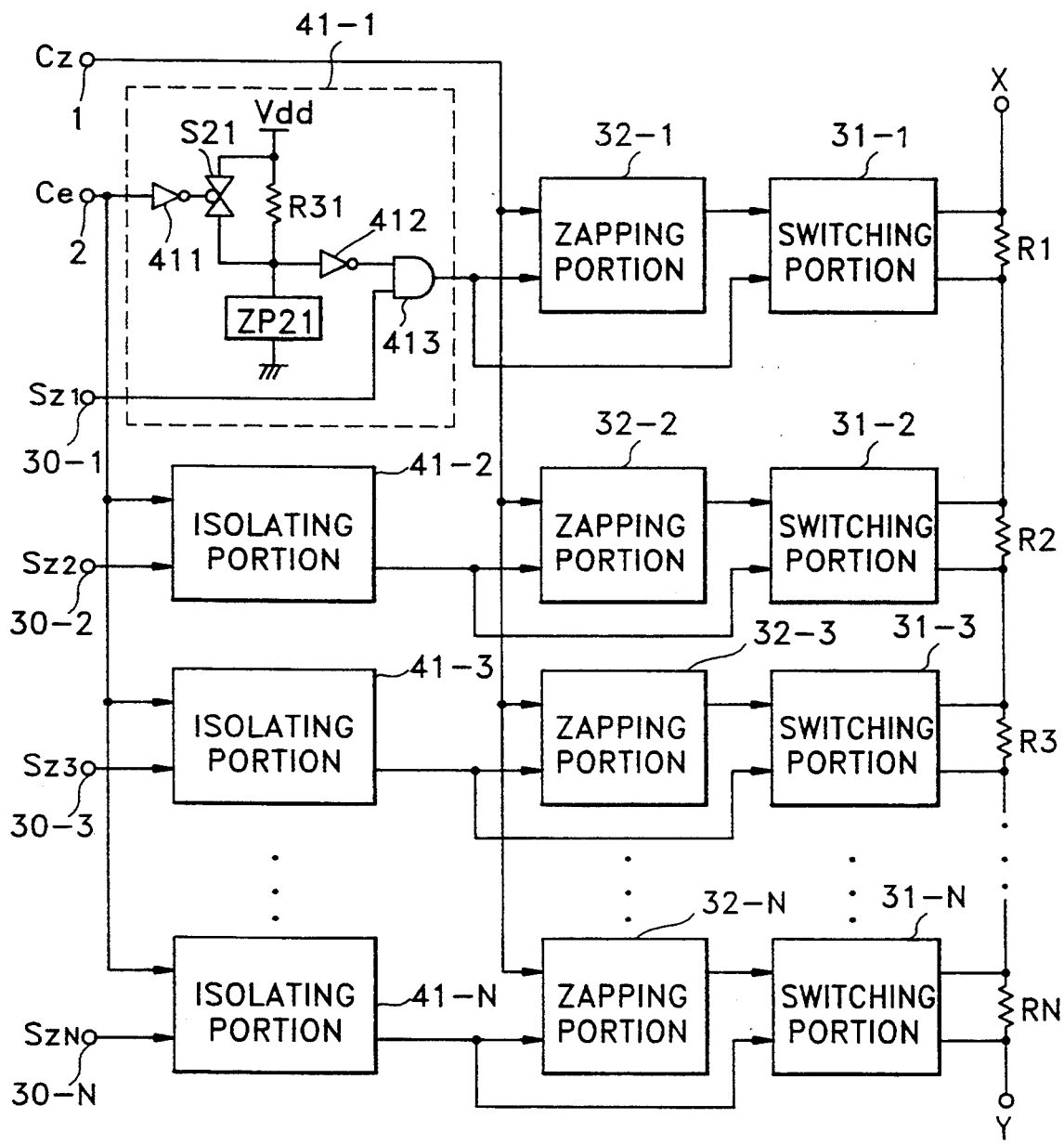
FIG. 4 is a circuit diagram of a circuit for adjusting a circuit parameter for a semiconductor integrated circuit according to a second embodiment of the present invention.

FIG. 4 illustrates a circuit for adjusting a circuit parameter for a semiconductor integrated circuit according to a second embodiment of the present invention, in which the input terminals 30-1 to 30-N for trimming signals $S_{Z1}$-$S_{ZN}$ are isolated after completion of zapping, so as to remove the effects of any undesirable external signals, such as static electricity or spiking.

More particularly, the input terminals $30_1$-$30_N$ are isolated in response to an end control signal Ce. The circuit of this embodiment includes isolating portions $41_1$-$41_N$ which, before end control signal Ce is activated (when "low"), receive trimming signals $S_{Z1}$-$S_{ZN}$ and output them without change, and, after end control signal Ce is activated (goes "high"), produce an output held at a predetermined value, to thereby isolate the input terminals $30_1$-$30_N$ from the rest of the circuit; zapping portions $32_1$-$32_N$ which are activated according to zapping control signal $C_Z$ to thereby perform zapping according to trimming signals $S_{Z1}$-$31_N$ input from isolating portions $41_1$-$41_N$, and switching portions $31_1$-$31_N$ which, before zapping control signal $C_Z$ is activated, directly receive the outputs of isolating portions $41_1 41_N$ to thereby open or close respective network elements $R_1$-$R_N$, and after zapping control signal $C_Z$ is activated, open or close network elements $R_1$-$R_N$ according to the trimming signals.

With continuing reference to FIG. 4, zapping portions $32_1$-$32_N$ and switching portions $31_1$-$31_N$ are the same as those of FIG. 3 and will therefore not be described here. Further, since each of the N isolating portions $41_1$-$41_N$ have the same configuration and operation, only the first isolating portion $41_1$ is described below.

First isolating portion $41_1$ includes a switch $S_{21}$ (a CMOS transmission gate in this embodiment) for applying or blocking power source voltage Vdd according to the logic level of the end control signal Ce; a zappable element $ZP_{21}$ which can be opened by power source voltage Vdd supplied through transmission gate $S_{21}$; and, a holding portion comprised of inverter 412 and AND gate 413 which, before end control signal Ce is activated (when "low"), receives a logic high at one input of the AND gate 413, to thereby output first trimming signal $S_{Z1}$ input via the other input without change, and conversely, when zappable element $ZP_{21}$ is opened, holds the output low regardless of the logic level of first trimming signal $S_{Z1}$.

Now, the operation of the first isolating portion $41_1$ constructed as above will be explained in terms of two cases: prior to activation of end control signal Ce, and after the activation of the end control signal Ce.

Before the end control signal Ce is activated (when "low"), transmission gate $S_{21}$ is opened and a logic high (i.e., ground potential held low via zappable element $ZP_{21}$ and inverted by inverter 412) is applied to a first input of AND gate 413, and either the high, or low input of the other input is output according to the logic level of the first trimming signal $S_{Z1}$. In other words, the first trimming signal $S_1$ is output without change.

On the other hand, if end control signal Ce is activated (goes "high"), the control input of the transmission gate $S_{21}$ is at a logic low level, to thereby render the transmission gate $S_{21}$ conductive, whereby power source voltage Vdd is directly applied to and thereby opens zappable element $ZP_{21}$, thus rendering the input to the inverter 412 "high", and the corresponding input to the AND gate 413 "low," whereby the AND gate 413 always outputs a low logic level signal regardless of the logic level of the first trimming signal $S_{Z1}$, to thereby isolate the input terminal 301 from the rest of the circuit.

Figure 5:
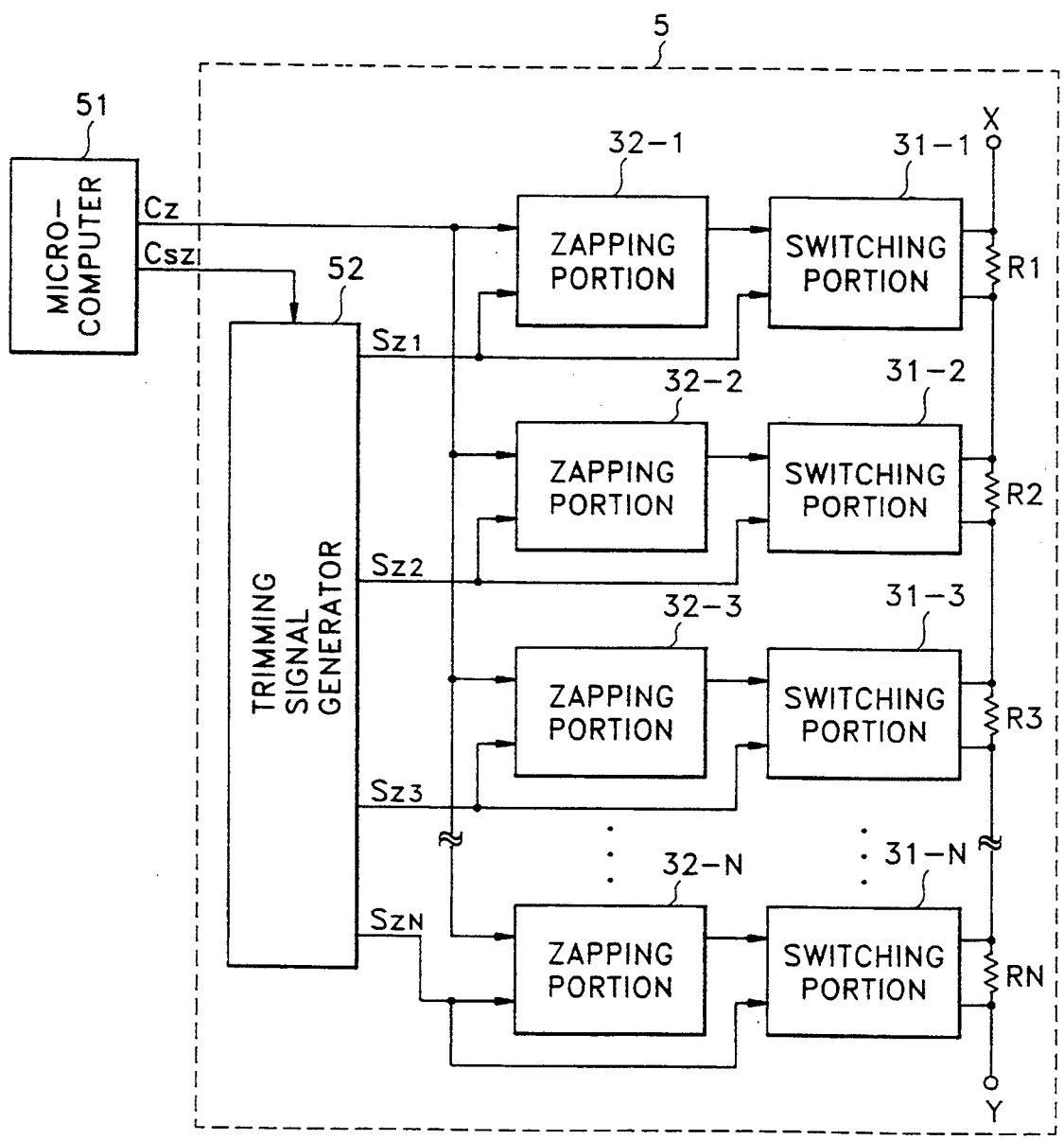
FIG. 5 is a circuit diagram of a circuit for adjusting a circuit parameter for a semiconductor integrated circuit according to a third embodiment of the present invention, which enables zapping after packaging.

FIG. 5 is a circuit diagram of a circuit for adjusting a circuit parameter for a semiconductor integrated circuit, which is capable of being zapped after packaging, by using an external controller such as a microcomputer, in accordance with a third embodiment of the present invention. More particularly, the circuit of this embodiment includes a trimming signal generator 52 for receiving trimming control signals $C_{SZ}$ in the form of a serial transmission from microcomputer 51, and generating N corresponding trimming signals $S_{Z1}$-$S_{ZN}$; zapping portions $32_1$-$32_N$ activated according to zapping control signal $C_Z$ for performing zapping according to the trimming signals $S_{Z1}$-$S_{ZN}$; and, switching portions $31_1$-$31_n$ which, before zapping control signal $C_Z$ is activated, directly receive trimming signals $S_{Z1}$-$S_{ZN}$, to thereby open or close respective network elements $R_1$-$R_N$, and which, after zapping control signal $C_Z$ is activated, open or close respective network elements $R_1$-$R_N$ according to the trimming signals. This circuit enables zapping even after packaging by reducing the number of pins necessary for external interfacing required to perform zapping.

Generally, a zapping circuit having N network elements $R_1$-$R_N$ between nodes X and Y requires N input terminals for receiving trimming signals $S_{Z1}$-$S_{ZN}$. However, since it is desirable to reduce the number of externally interfaced pins in a semiconductor integrated circuit, it is inefficient to use N terminals (and pins) for zapping. This is why zapping has heretofore been done prior to packaging. In accordance with this invention, however, by installing the trimming signal generator 52 for serially interfacing with microcomputer 51 to thereby generate trimming signals $S_{Z1}$-$S_{ZN}$ internally of chip 5, the number of external pins required is drastically reduced, to thereby enable zapping after packaging.

With reference to FIG. 5, zapping portions $32_1$-$32_N$ and switching portions $31_1$-$31_N$ are the same as those of FIG. 3 and therefore will not be described in detail. The trimming signal generator 52 receives trimming control signal $C_{SZ}$ from the external microcometer 51 in the form of a serial transmission of trimming signal values, (e.g., as a stream of "0" or "1" bits), and generates N corresponding trimming signals $S_{Z1}$-$S_{ZN}$. Then, the N trimming signals $S_{Z1}$-$S_{ZN}$ are input to zapping portions $32_1$-$32_N$ and switching portions $31_1$-$31_N$. Before zapping control signal $C_Z$ from microcomputer 51 is activated, switching portions $31_1$-$31_N$ fix various resistance values according to various combinations of trimming signals $S_{Z1}$-$S_{ZN}$ until it is ascertained that an achieved value is equal to the target value. When the optimum combination of trimming signals is realized, the zapping control signal $C_Z$ is activated, and that combination of trimming signals is fixed. Such a trimming signal generator 52 can be embodied by a counter.

Figure 6:
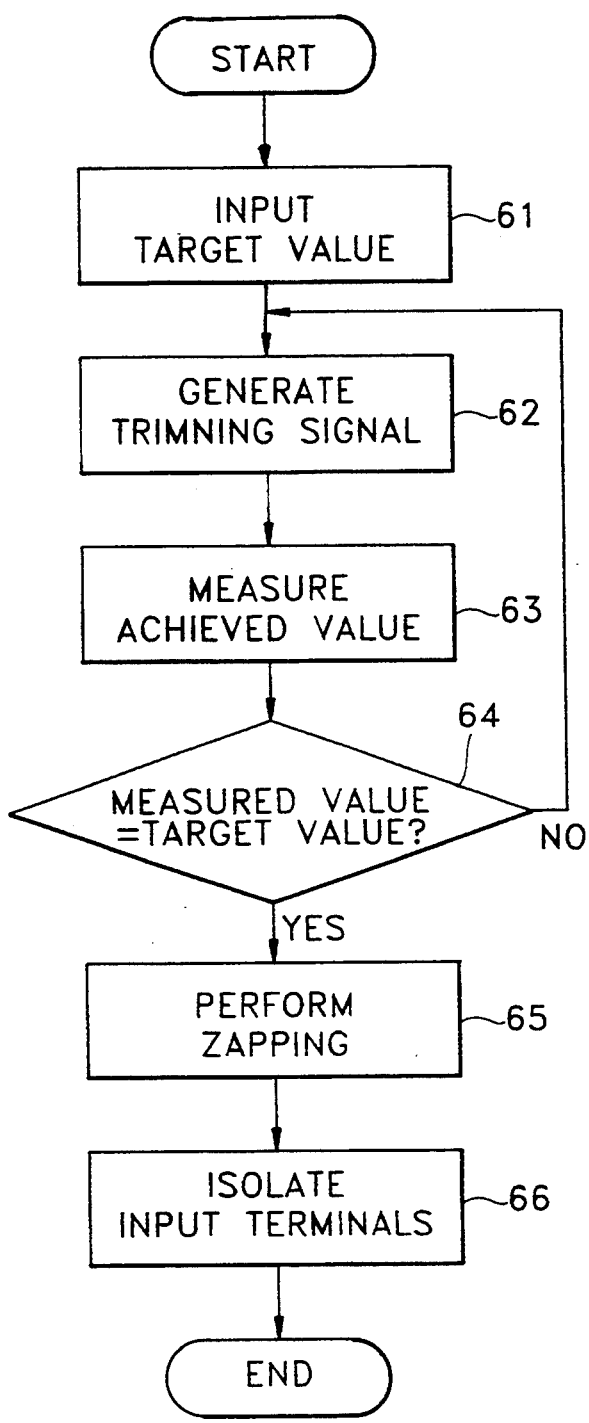
FIG. 6 is a flowchart illustrating how a circuit parameter for a semiconductor integrated circuit is adjusted in accordance with the present invention.

FIG. 6 is a flowchart for a method for adjusting a circuit parameter of a semiconductor integrated circuit in accordance with the present invention. Referring to FIG. 6, in step 61, a system controller such as microcomputer 51 receives (or determines) a target value for a circuit parameter between nodes X and Y. Once the target value is input (or determined), in step 62, trimming signals $S_{Z1}$-$S_{ZN}$ are generated in accordance with the output of the microcomputer 51. Then, in step 63, the achieved value of the circuit parameter which is fixed by switches that are opened or closed according to respective trimming signals, is measured. Subsequently, in step 64, the measured value is compared with the target value. If the measured value is equal to (or sufficiently close to) the target value, in step 65, zapping is performed in accordance with the trimming signals and then the input terminals are isolated in step 66, but if not, steps 62 and 63 are repeated until the target value is reached.

The above-discussed embodiments of the present invention have been explained with the elements of the network being resistors. However, it should be clearly understood that the network elements may be capacitors or any other device or element whose value requires trimming or adjustment.

As described above, the circuit for adjusting a circuit parameter of the present invention is capable of precisely achieving a predetermined target value by ascertaining whether a circuit parameter is consistent with a target value prior to zapping, and does not directly apply an electrical voltage or current to the network elements, thereby ensuring accurate adjustment of the circuit parameter during zapping, while also avoiding damage to the network or other circuit elements.

In addition, the circuit for adjusting a circuit parameter having an isolation function like that of the present invention is resistant against noise like static electricity or spiking. The circuit for adjusting a circuit parameter incorporating a serial interfacing function reduces the number or required pins, so as to enable zapping after packaging.

While the present invention has been particularly shown and described with reference to particular embodiments thereof, it will be understood by those skilled in the art that various changes in form and details may be effected therein without departing from the spirit and scope of the invention as defined by the appended claims. Also, though the exemplified embodiments are described and illustrated by way of a series network with parallel connections for the respective switching means, the present invention is equally adaptable for parallel networks whose corresponding switching means are connected thereto in series or parallel.

What is claimed is:

1. A circuit parameter adjustment circuit for adjusting a circuit parameter of a circuit having N network elements connected between two nodes, said circuit parameter adjustment circuit comprising:

N zapping devices activated in response to a zapping control signal, when said zapping control signal is at a first logic level, said N zapping devices, when activated, being zapped in response to respective ones of N trimming signals having a first logic level, and being unzapped in response to respective ones of said N trimming signals having a second logic level;

wherein zapped ones of said N zapping devices generate a first output having a first logic level, and unzapped ones of said N zapping devices generate a second output having a second logic level;

N switching devices coupled between respective ones of said N zapping devices and respective ones of said N network elements;

wherein, when said zapping control signal is at a second logic level, a first subset of said N switching devices are responsive to respective ones of said N trimming signals having said first logic level for bypassing corresponding ones of said N network elements, and a second subset of said N switching devices are responsive to respective ones of said N trimming signals having said second logic level for not bypassing corresponding ones of said N network elements, to thereby enable testing of the achieved value of the circuit parameter prior to zapping;

wherein, when said zapping control signal is at said first logic level, said first subset of said N switching devices are responsive to said first output of respective zapped ones of said N zapping devices for bypassing respective ones of said N network elements, and said second subset of said N switching devices are responsive to said second output of respective unzapped ones of said N zapping devices for not bypassing respective ones of said N network elements;

wherein N is an integer equal to or greater than two; and, wherein each one of said N switching devices comprises:

a switch control circuit responsive to a corresponding one of said N trimming signals, when said zapping control signal is at said second logic level, for generating a switch control signal, and responsive to the output of a corresponding one of said N zapping devices, when said zapping control signal is at said second logic level, for generating said switch control signal; and, a switch coupled between said switch control circuit and a corresponding one of said N network elements, and responsive to said switch control signal for bypassing or not bypassing said corresponding one of said N network elements.

2. The circuit as set forth in claim 1, wherein said switch comprises a CMOS transmission gate.

3. The circuit as set forth in claim 1, wherein said control circuit comprises:

a resistor having a first end coupled to a first voltage, and a second end;

a first MOS transistor having a gate electrode coupled to said second end of said resistor, and a second electrode coupled to a reference potential;

a second MOS transistor having a gate electrode coupled to said output of said corresponding one of said N zapping devices, a first electrode coupled to said second end of said resistor, and a second electrode coupled to said second electrode of said first MOS transistor; and, an output node intermediate said second end of said resistor and said first electrode of said first MOS transistor, said output node being coupled to a control input of said switch.

4. The circuit as set forth in claim 3, wherein said switch has a first portion coupled to a first end of said corresponding one of said N network elements, and a second portion coupled to a second end of said corresponding one of said N network elements.

5. The circuit as set forth in claim 1, wherein each one of said N zapping devices comprises:

a zapping controller having a first input coupled to said zapping control signal and a second input coupled to a corresponding one of said N trimming signals, said zapping controller being activated when said zapping control signal is at said first logic level;

wherein said zapping controller generates a zap control output having a first logic level either when said zapping control signal is at said second logic level or when said zapping control signal is at said first logic level and said corresponding one of said N trimming signals is at said second logic level;

wherein said zapping controller generates a zap control output having a second logic level when said zapping control signal is at said first logic level and said corresponding one of said N trimming signals is at said first logic level; and, a zappable element coupled to said zap control output, said zappable element being zapped in response to said zap control output, when said zap control output is at said second logic level.

6. The circuit as set forth in claim 4, wherein said zapping controller comprises:

a NAND gate having a first input coupled to said zapping control signal and a second input coupled to said corresponding one of said N trimming signals, and an output;

a switch having a control input coupled to said output of said NAND gate;

a resistor having a first end coupled to a first voltage, and a second end;

an output node coupled between said second end of said resistor and said zappable element; and, wherein said switch has a first portion coupled to said first end of said resistor and a second portion coupled to said output node.

7. The circuit as set forth in claim 6, wherein said zappable element comprises a fuse.

8. The circuit as set forth in claim 6, wherein said zappable element comprises a Zener diode.

9. The circuit as set forth in claim 6, wherein each one of said N zapping devices comprises:

a zapping controller having a first input coupled to said zapping control signal and a second input coupled to a corresponding one of said N trimming signals, said zapping controller being activated when said zapping control signal is at said first logic level;

wherein said zapping controller generates a zap control output having a first logic level either when said zapping control signal is at said second logic level or when said zapping control signal is at said first logic level and said corresponding one of said N trimming signals is at said second logic level;

wherein said zapping controller generates a zap control output having a second logic level when said zapping control signal is at said first logic level and said corresponding one of said N trimming signals is at said first logic level; and, a zappable element coupled to said zap control output, said zappable element being zapped in response to said zap control output, when said zap control output is at said second logic level.

10. The circuit as set forth in claim 1, wherein said circuit parameter is resistance.

11. The circuit as set forth in claim 1, wherein said circuit parameter is capacitance.

12. The circuit as set forth in claim 5, wherein said zappable element comprises a fuse.

13. The circuit as set forth in claim 1, further comprising:
N input terminals for receiving respective ones of said N trimming signals;
N isolation devices coupled between respective ones of said N input terminals and respective ones of said N zapping devices, said N isolation devices receiving an end control signal and producing an output signal having the same logic level as said respective ones of said N trimming signals, when said end control signal is at a first logic level;
wherein said output signals of said N isolation devices are coupled to an input of respective ones of said N zapping devices, and to an input of respective ones of said N switching devices; and,
wherein said N isolation devices isolate respective ones of said N input terminals from the remainder of the circuit when said end control signal is at said first logic level.

14. The circuit as set forth in claim 13, wherein each one of said N isolation devices comprises:
a switch having a control input coupled to said end control signal;
a resistor having a first end coupled to a first voltage, and a second end;
a zappable element coupled between said second end of said resistor and a reference potential;
wherein said switch includes a first portion coupled to said first end of said resistor and a second portion coupled to a control node intermediate said second end of said resistor and said zappable element;
an AND gate having a first input node, a second input node, and an output node;
an inverter coupled between said control node and said first input node of said AND gate;
wherein a corresponding one of said N trimming signals is coupled to said second input node of said AND gate;
wherein said output node of said AND gate is coupled to an input of a corresponding one of said N zapping devices and to an input of a corresponding one of said N switching devices; and,
wherein said switch is turned on in response to said end control signal, when said end control signal is at said first logic level, to thereby apply said first voltage to said zappable element, said zappable element being zapped in response to said first voltage.

15. The circuit as set forth in claim 1, further comprising:
a programmable device for generating a serial stream of said N trimming signals; and
a trimming signal generator coupled to said programmable device for performing a serial to parallel conversion of said serial stream, and for generating said N trimming signals in parallel.

16. The circuit as set forth in claim 15, wherein the circuit is a semiconductor integrated circuit formed on a chip which is contained within a package, with all previously recited elements of the circuit being formed on the chip except said programmable device, to thereby facilitate zapping after packaging.

17. The circuit as set forth in claim 3, further comprising:
a programmable device for generating a serial stream of said N trimming signals; and,
a trimming signal generator coupled to said programmable device for performing a serial to parallel conversion of said serial stream, and for generating said N trimming signals in parallel.

18. The circuit as set forth in claim 13, further comprising:
a programmable device for generating a serial stream of said N trimming signals; and,
a trimming signal generator coupled to said programmable device for performing a serial to parallel conversion of said serial stream, and for generating said N trimming signals in parallel.

19. The circuit as set forth in claim 3, further comprising:
N input terminals for receiving respective ones of said N trimming signals; and,
N isolation devices coupled between respective ones of said N input terminals and respective ones of said N zapping devices, said N isolation devices receiving an end control signal and producing an output signal having the same logic level as said respective ones of said N trimming signals when said end control signal is at a second logic level;
wherein said output signals of said N isolation devices are coupled to an input of respective ones of said N zapping devices, and to an input of respective ones of said N switching devices; and,
wherein said N isolation devices isolate respective ones of said N input terminals from the remainder of the circuit when said end control signal is at said first logic level.

20. A circuit parameter adjustment circuit for adjusting a circuit parameter of a circuit having N network elements connected between two nodes, said circuit parameter adjustment circuit comprising:
N zapping devices activated in response to a zapping control signal, when said zapping control signal is at a first logic level, said N zapping devices, when activated, being zapped in response to respective ones of N trimming signals having a first logic level, and being unzapped in response to respective ones of said N trimming signals having a second logic level;
wherein zapped ones of said N zapping devices generate a first output having a first logic level, and unzapped ones of said N zapping devices generate a second output having a second logic level;
N switching devices coupled between respective ones of said N zapping devices and respective ones of said N network elements;
wherein, when said zapping control signal is at a second logic level, a first subset of said N switching devices are responsive to respective ones of said N trimming signals having said first logic level for bypassing corresponding ones of said N network elements, and a second subset of said N switching devices are responsive to respective ones of said N trimming signals having said second logic level for not bypassing corresponding ones of said N network elements, to thereby enable testing of the achieved value of the circuit parameter prior to zapping;
wherein, when said zapping control signal is at said first logic level, said first subset of said N switching devices are responsive to said first output of respective zapped ones of said N zapping devices for bypassing respective ones of said N network elements, and said second subset of said N switching devices are responsive to said second output of respective unzapped ones of said N zapping devices for not bypassing respective ones of said N network elements;

wherein N is an integer equal to or greater than two; and, wherein each one of said N zapping devices comprises:

a zapping controller having a first input coupled to said zapping control signal and a second input coupled to a corresponding one of said N trimming signals, said zapping controller being activated when said zapping control signal is at said first logic level;

wherein said zapping controller generates a zap control output having a first logic level either when said zapping control signal is at said second logic level or when said zapping control signal is at said first logic level and said corresponding one of said N trimming signals is at said second logic level;

wherein said zapping controller generates a zap control output having a second logic level when said zapping control signal is at said first logic level and said corresponding one of said N trimming signals is at said first logic level; and, a zappable element coupled to said zap control output, said zappable element being zapped in response to said zap control output, when said zap control output is at said second logic level.

21. The circuit as set forth in claim 20, wherein each one of said N switching devices comprises:

a switch control circuit responsive to a corresponding one of said N trimming signals, when said zapping control signal is at said second logic level, for generating a switch control signal, and responsive to the output of a corresponding one of said N zapping devices, when said zapping control signal is at said second logic level, for generating said switch control signal; and, a switch coupled between said switch control circuit and a corresponding one of said N network elements, and responsive to said switch control signal for bypassing or not bypassing said corresponding one of said N network elements.

22. The circuit as set forth in claim 21, wherein said switch comprises a CMOS transmission gate.

23. The circuit as set forth in claim 21, wherein said control circuit comprises:

a resistor having a first end coupled to a first voltage, and a second end;

a first MOS transistor having a gate electrode coupled to said second end of said resistor, and a second electrode coupled to a reference potential;

a second MOS transistor having a gate electrode coupled to said output of said corresponding one of said N zapping devices, a first electrode coupled to said second end of said resistor, and a second electrode coupled to said second electrode of said first MOS transistor; and, an output node intermediate said second end of said resistor and said first electrode of said first MOS transistor, said output node being coupled to a control input of said switch.

24. The circuit as set forth in claim 23, wherein said switch has a first portion coupled to a first end of said corresponding one of said N network elements, and a second portion coupled to a second end of said corresponding one of said N network elements.

25. The circuit as set forth in claim 24, wherein said zapping controller comprises:

a NAND gate having a first input coupled to said zapping control signal and a second input coupled to said corresponding one of said N trimming signals, and an output;

a switch having a control input coupled to said output of said NAND gate;

a resistor having a first end coupled to a first voltage, and a second end;

an output node coupled between said second end of said resistor and said zappable element; and, wherein said switch has a first portion coupled to said first end of said resistor and a second portion coupled to said output node.

26. The circuit as set forth in claim 25, wherein said zappable element comprises a fuse.

27. The circuit as set forth in claim 25, wherein said zappable element comprises a Zener diode.

28. The circuit as set forth in claim 20, wherein said circuit parameter is resistance.

29. The circuit as set forth in claim 20, wherein said circuit parameter is capacitance.

30. The circuit as set forth in claim 20, further comprising:

N input terminals for receiving respective ones of said N trimming signals; and, N isolation devices coupled between respective ones of said N input terminals and respective ones of said N zapping devices, said N isolation devices receiving an end control signal and producing an output signal having the same logic level as said respective ones of said N trimming signals, when said end control signal is at a first logic level;

wherein said output signals of said N isolation devices are coupled to an input of respective ones of said N zapping devices, and to an input of respective ones of said N switching devices; and, wherein said N isolation devices isolate respective ones of said N input terminals from the remainder of the circuit when said end control signal is at said first logic level.

31. The circuit as set forth in claim 30, wherein each one of said N isolation devices comprises:

a switch having a control input coupled to said end control signal;

a resistor having a first end coupled to a first voltage, and a second end;

a zappable element coupled between said second end of said resistor and a reference potential;

wherein said switch includes a first portion coupled to said first end of said resistor and a second portion coupled to a control node intermediate said second end of said resistor and said zappable element;

an AND gate having a first input node, a second input node, and an output node;

an inverter coupled between said control node and said first input node of said AND gate;

wherein a corresponding one of said N trimming signals is coupled to said second input node of said AND gate;

wherein said output node of said AND gate is coupled to an input of a corresponding one of said N zapping devices and to an input of a corresponding one of said N switching devices; and, wherein said switch is turned on in response to said end control signal, when said end control signal is at said first logic level, to thereby apply said first voltage to said zappable element, said zappable element being zapped in response to said first voltage.

32. The circuit as set forth in claim 20, further comprising:
a programmable device for generating a serial stream of said N trimming signals; and
a trimming signal generator coupled to said programmable device for performing a serial to parallel conversion of said serial stream, and for generating said N trimming signals in parallel.

33. The circuit as set forth in claim 32, wherein the circuit is a semiconductor integrated circuit formed on a chip which is contained within a package, with all previously recited elements of the circuit being formed on the chip except said programmable device, to thereby facilitate zapping after packaging.

34. The circuit as set forth in claim 23, further comprising:
a programmable device for generating a serial stream of said N trimming signals; and,
a trimming signal generator coupled to said programmable device for performing a serial to parallel conversion of said serial stream, and for generating said N trimming signals in parallel.

35. The circuit as set forth in claim 31, further comprising:
a programmable device for generating a serial stream of said N trimming signals; and,
a trimming signal generator coupled to said programmable device for performing a serial to parallel conversion of said serial stream, and for generating said N trimming signals in parallel.

36. The circuit as set forth in claim 23, further comprising:
N input terminals for receiving respective ones of said N trimming signals; and,
N isolation devices coupled between respective ones of said N input terminals and respective ones of said N zapping devices, said N isolation devices receiving an end control signal and producing an output signal having the same logic level as said respective ones of said N trimming signals when said end control signal is at a second logic level;
wherein said output signals of said N isolation devices are coupled to an input of respective ones of said N zapping devices, and to an input of respective ones of said N switching devices; and,
wherein said N isolation devices isolate respective ones of said N input terminals from the remainder of the circuit when said end control signal is at said first logic level.

37. A circuit parameter adjustment circuit for adjusting a circuit parameter of a circuit having N network elements connected between two nodes, said circuit parameter adjustment circuit comprising:
N zapping devices activated in response to a zapping control signal, when said zapping control signal is at a first logic level, said N zapping devices, when activated, being zapped in response to respective ones of N trimming signals having a first logic level, and being unzapped in response to respective ones of said N trimming signals having a second logic level;
wherein zapped ones of said N zapping devices generate a first output having a first logic level, and unzapped ones of said N zapping devices generate a second output having a second logic level;
N switching devices coupled between respective ones of said N zapping devices and respective ones of said N network elements;
wherein, when said zapping control signal is at a second logic level, a first subset of said N switching devices are responsive to respective ones of said N trimming signals having said first logic level for bypassing corresponding ones of said N network elements, and a second subset of said N switching devices are responsive to respective ones of said N trimming signals having said second logic level for not bypassing corresponding ones of said N network elements, to thereby enable testing of the achieved value of the circuit parameter prior to zapping;
wherein, when said zapping control signal is at said first logic level, said first subset of said N switching devices are responsive to said first output of respective zapped ones of said N zapping devices for bypassing respective ones of said N network elements, and said second subset of said N switching devices are responsive to said second output of respective unzapped ones of said N zapping devices for not bypassing respective ones of said N network elements;
wherein N is an integer equal to or greater than two;
N input terminals for receiving respective ones of said N trimming signals;
N isolation devices coupled between respective ones of said N input terminals and respective ones of said N zapping devices, said N isolation devices receiving an end control signal and producing an output signal having the same logic level as said respective ones of said N trimming signals, when said end control signal is at a first logic level;
wherein said output signals of said N isolation devices are coupled to an input of respective ones of said N zapping devices, and to an input of respective ones of said N switching devices; and,
wherein said N isolation devices isolate respective ones of said N input terminals from the remainder of the circuit when said end control signal is at said first logic level.

38. The circuit as set forth in claim 37, wherein each one of said N isolation devices comprises:
a switch having a control input coupled to said end control signal;
a resistor having a first end coupled to a first voltage, and a second end;
a zappable element coupled between said second end of said resistor and a reference potential;
wherein said switch includes a first portion coupled to said first end of said resistor and a second portion coupled to a control node intermediate said second end of said resistor and said zappable element;
an AND gate having a first input node, a second input node, and an output node;
an inverter coupled between said control node and said first input node of said AND gate;

wherein a corresponding one of said N trimming signals is coupled to said second input node of said AND gate;

wherein said output node of said AND gate is coupled to an input of a corresponding one of said N zapping devices and to, an input of a corresponding one of said N switching devices; and, wherein said switch is turned on in response to said end control signal, when said end control signal is at said first logic level, to thereby apply said first voltage to said zappable element, said zappable element being zapped in response to said first voltage.

39. The circuit as set forth in claim 37, further comprising:

a programmable device for generating a serial stream of said N trimming signals; and, a trimming signal generator coupled to said programmable device for performing a serial to parallel conversion of said serial stream, and for generating said N trimming signals in parallel.

40. The circuit as set forth in claim 38, further comprising:

a programmable device for generating a serial stream of said N trimming signals; and, a trimming signal generator coupled to said programmable device for performing a serial to parallel conversion of said serial stream, and for generating said N trimming signals in parallel.

41. The circuit as set forth in claim 40, wherein the circuit is a semiconductor integrated circuit formed on a chip which is contained within a package, with all previously recited elements of the circuit being formed on the chip except said programmable device, to thereby facilitate zapping after packaging.

42. The circuit as set forth in claim 39, wherein the circuit is a semiconductor integrated circuit formed on a chip which is contained within a package, with all previously recited elements of the circuit being formed on the chip except said programmable device, to thereby facilitate zapping after packaging.

43. The circuit as set forth in claim 37, wherein said circuit parameter is resistance.

44. The circuit as set forth in claim 37, wherein said circuit parameter is capacitance.

45. A circuit parameter adjustment circuit for adjusting a circuit parameter of a circuit having N network elements connected between two nodes, said circuit parameter adjustment circuit comprising:

N zapping devices activated in response to a zapping control signal, when said zapping control signal is at a first logic level, said N zapping devices, when activated, being zapped in response to respective ones of N trimming signals having a first logic level, and being unzapped in response to respective ones of said N trimming signals having a second logic level;

wherein zapped ones of said N zapping devices generate a first output having a first logic level, and unzapped ones of said N zapping devices generate a second output having a second logic level;

N switching devices coupled between respective ones of said N zapping devices and respective ones of said N network elements;

wherein, when said zapping control signal is at a second logic level, a first subset of said N switching devices are responsive to respective ones of said N trimming signals having said first logic level for bypassing corresponding ones of said N network elements, and a second subset of said N switching devices are responsive to respective ones of said N trimming signals having said second logic level for riot bypassing corresponding ones of said N network elements, to thereby enable testing of the achieved value of the circuit parameter prior to zapping;

wherein, when said zapping control signal is at said first logic level, said first subset of said N switching devices are responsive to said first output of respective zapped ones of said N zapping devices for bypassing respective ones of said N network elements, and said second subset of said N switching devices are responsive to said second output of respective unzapped ones of said N zapping devices for not bypassing respective ones of said N network elements;

wherein N is an integer equal to or greater than two;

a programmable device for generating a serial stream of said N trimming signals; and, a trimming signal generator coupled to said programmable device for performing a serial to parallel conversion of said serial stream, and for generating said N trimming signals in parallel.

46. The semiconductor device as set forth in claim 45, wherein the circuit is a semiconductor integrated circuit formed on a chip which is contained within a package, with all previously recited elements of the circuit being formed on the chip except said programmable device, to thereby facilitate zapping after packaging.

47. The circuit as set forth in claim 45, wherein said circuit parameter is resistance.

48. The circuit as set forth in claim 45, wherein said circuit parameter is capacitance.

* * * * *